US006281073B1

United States Patent
Lee

(10) Patent No.: US 6,281,073 B1
(45) Date of Patent: Aug. 28, 2001

(54) METHOD FOR FABRICATING DYNAMIC RANDOM ACCESS MEMORY CELL

(75) Inventor: Young Jun Lee, Cheongju (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/617,312

(22) Filed: Jul. 14, 2000

(30) Foreign Application Priority Data

Sep. 3, 1999 (KR) .................................................. 99-37353

(51) Int. Cl.[7] .............................................. H01L 21/8242
(52) U.S. Cl. ......................... 438/255; 438/239; 438/240; 438/241; 438/242; 438/253; 438/254; 438/256; 438/396; 438/397; 438/398; 438/399
(58) Field of Search .................................... 438/239–242, 438/396–399, 253–256

(56) References Cited

U.S. PATENT DOCUMENTS

| | | | |
|---|---|---|---|
| 5,854,106 | * 12/1998 | Wu ....................................... | 438/253 |
| 6,037,215 | * 3/2000 | Lee et al. .............................. | 438/253 |
| 6,100,137 | * 9/2000 | Chen et al. ........................... | 438/253 |
| 6,127,260 | * 10/2000 | Huang .................................. | 438/629 |
| 6,187,624 | * 2/2001 | Huang .................................. | 438/253 |

FOREIGN PATENT DOCUMENTS 40-1243573-A * 9/1989 (JP) .
40-2260453-A * 10/1990 (JP) .

OTHER PUBLICATIONS

Kang et al., "High Manufacturable Process Technology for Reliable 256 Mbit and 1Gbit DRAMs;" IEDM 94, pp. 635–638.
S.P. Sim et al., "A New Planar Stacked Technology (PST) for Scaled and Embedded DRAMs;" IEDM 96, pp. 597–600.

* cited by examiner

Primary Examiner—John F. Niebling
Assistant Examiner—Jennifer M. Kennedy
(74) Attorney, Agent, or Firm—Fleshner & Kim, LLP

(57) ABSTRACT

The present invention relates to a method for fabricating a semiconductor device, and in particular to a method for fabricating a bit line and a capacitor of a DRAM cell including: a step of forming contact holes on a first insulation film formed on a semiconductor substrate; a step of forming plugs in the contact hole; a step of forming a contact hole on a second insulation film formed on the first insulation film; a step of forming a bit line and a third insulation film pattern on the second insulation film; a step of forming spacers at the side portions of the third insulation film pattern and the contact holes; a step of forming a fourth insulation film pattern; a step of sequentially forming a third conductive film and a fifth insulation film; a step of removing the third conductive film and the fifth insulation film in order to expose the upper surface of the fourth insulation film pattern; a step of removing the fourth insulation film and the fifth insulation film; and a step of sequentially forming a sixth insulation film and a fourth conductive film.

17 Claims, 9 Drawing Sheets

METHOD FOR FABRICATING DYNAMIC RANDOM ACCESS MEMORY CELL

BACKGROUND OF THE INVENTION

1. Field of the Invention The present invention relates to a method for fabricating a semiconductor device, and in particular to a method for fabricating a bit line and a capacitor of a dynamic random access memory DRAM cell.

2. Description of the Background Art A conventional method for fabricating a dynamic random access memory DRAM cell will now be described with reference to FIGS. 1a to 1k.

As illustrated in FIG. 1a, a trench is formed at an upper portion of a semiconductor substrate 1, and filled with an insulation material, thereby forming a field insulation film 3. A gate 9 consisting of a gate insulation film 5 and a gate electrode 7 is formed on the semiconductor substrate 1 divided into an active region A and an isolation region B by the field insulation film 3. An insulation film is formed on the semiconductor substrate 1 including the gate 9, and an anisotropic etching process is performed thereon without a mask, thereby forming first sidewall spacers 11 at both side portions of the gate 9. The first sidewall spacers 11 serve to insulate a storage node contact plug 17 and a bit line 23 from the gate 9 during a process of forming the storage node contact plug 17 and the bit line 23. A first doped region 12a and a second doped region 12b operated as a source and a drain are formed at the upper portion of the semiconductor substrate 1 exposed between the gates 9 in accordance with an ion implantation process, by using the gate 9 and the first sidewall spacers 11 as masks.

As shown in FIG. 1b, a first insulation film is formed over the semiconductor substrate 1, and patterned according to a photoetching process using a photoresist film (not shown) so that the upper surface of the first doped region 12a between the gates 9 can be exposed, thereby forming a first insulation film pattern 13. As a result, a first contact hole 15 is formed.

Referring to FIG. 1c, a first conductive film consisting of a polycrystalline silicon is formed in the first contact hole 15 and on the first insulation film 13. Thereafter, an etching process or a chemical mechanical polishing CMP process is carried out until the upper surface of the first insulation film 13 is exposed, thereby forming the storage node contact plug 17 consisting of the first conductive film. The storage node contact plug 17 serves to electrically connect the first doped region 12a to a storage node contact 40 to be discussed later. A second insulation film 19 operated as an interlayer insulation film is formed over the semiconductor substrate 1.

As depicted in FIG. 1d, the second insulation film 19 and the first insulation film 13 are sequentially patterned in accordance with the photoetching process using a photoresist film (not shown), and thus a second contact hole 21 is formed so that the upper surface of the second doped region 12b can be exposed.

As illustrated in FIG. 1e, a second conductive film consisting of a polycrystalline silicon is formed in the second contact hole 21 and on the second insulation film 19, and patterned by using a photoresist film (not shown), thereby forming the bit line 23. The bit line 23 is electrically connected to the second doped region 12b. Then, a third insulation film 25 operated as an interlayer insulation film is formed over the semiconductor substrate 1. After the third insulation film 25 is formed, a planarization process is performed.

As shown in FIG. 1f, a first mask film consisting of a silicon or nitride is formed on the third insulation film 25. The first mask film is patterned by using a photoresist film (not shown) as a mask, thereby forming a first mask film pattern 27. Thereafter, a second mask film consisting of an identical material to the first mask film is formed over the semiconductor substrate 1 including the first mask film pattern 27. An anisotropic etching process is performed on the second mask film without a mask, thereby forming second sidewall spacers 29 at both side portions of the first mask film pattern 27. Hereinafter, a mask pattern consisting of the first mask film pattern 27 and the second sidewall spacers 29 are referred to as a 'hard mask'.

Referring to FIG. 1g, the third insulation film 25 and the second insulation film 19 are sequentially patterned by using the hard mask 31 as a mask, and thus a storage node contact hole 38 is formed so that the upper surface of the storage node contact plug 17 can be exposed.

As an integration degree of the semiconductor device is increased, a distance between the bit line 23 and the storage node contact plug 17 is reduced. Accordingly, if a misalignment is happened, the side portions of the bit line 23 may be exposed during the process of forming the storage node contact hole 38. In this case, the storage node contact to be formed in the storage node contact hole and the bit line may be electrically short. It is thus required to prepare for the misalignment by decreasing a diameter of the storage node contact hole 38. However, there is a limit to decrease the diameter of the storage node contact hole 38 in accordance with the photoetching process using a photoresist film. Therefore, the diameter of the storage node contact hole 38 is reduced as much as a width of the second sidewall spacer 29 by employing the hard mask 31.

Referring to FIG. 1h, a third conductive film consisting of a polycrystalline silicon is formed over the semiconductor substrate 1 including the storage node contact hole 38. Then, an etching or CMP process is performed until the upper surface of the hard mask 31 is exposed, thereby forming the storage node contact 40.

The storage node contact 40 serves to electrically connect a lower electrode 50b of the capacitor to the storage node contact plug 17, and prevent the third insulation film 25 from being etched during a process of photoetching a fourth insulation film consisting of an oxide in order to form a fourth insulation film pattern 29 to be discussed later.

As depicted in FIG. 1i, the fourth insulation film consisting of an oxide is formed on the hard mask 31 and the storage node contact 40. The fourth insulation film is photoetched by using a photoresist film (not shown), and thus the fourth insulation film pattern 29 is formed so that the upper surface of the storage node contact 40 can be exposed. Thereafter, a fourth conductive film 50 forming the lower electrode of the capacitor is formed over the semiconductor substrate 1 including the fourth insulation film pattern 29. The fourth conductive film 50 consists of a polycrystalline silicon. A fifth insulation film 33 consisting of an oxide is formed on the fourth conductive film 50.

As illustrated in FIG. 1j, an etching or CMP process is carried out until the upper surface of the fourth insulation film pattern 29 is exposed. Here, the lower electrode 50b is divided into storage cell units by the fourth insulation film pattern 29.

As shown in FIG. 1k, the fourth insulation film pattern 29 and the fifth insulation film 33 which consist of an oxide are removed according to a wet etching process. Here, the hard mask 31 consisting of a silicon or nitride prevents the third insulation film 25 from being etched. Then, a sixth insulation film 35 operated as a capacitor dielectric film is formed over the upper surface of the semiconductor substrate 1 including the lower electrode 50b. A fifth conductive film 37 consisting of a polycrystalline silicon and forming an upper electrode of the capacitor is formed on the sixth insulation film 35. The fabrication of the conventional DRAM cell is thus finished.

According to the conventional method for fabricating the bit line and the capacitor of the DRAM cell as described above, the bit line 23 is formed, and then the third insulation film 25 operated as an interlayer insulation film is formed, as shown in FIG. 1e. Here, the planarization process is added. Accordingly, the whole process becomes complicated, and a height of the DRAM cell is increased due to the third insulation film 25.

As the cell height is increased, an aspect ratio of the contact hole is increased during a succeeding process of forming the contact holes. As the aspect ratio is increased, a step coverage is deteriorated when the conductive material such as a polycrystalline silicon or metal is filled in the contact hole. As a result, when the storage node contact 40 is formed in the DRAM cell, and when the interconnection process using a metal is performed on a periphery region of the DRAM, the step coverage is deteriorated, and thus stability of the semiconductor device is reduced.

In addition, in the conventional art, the bit line is formed, and then the storage node contact is formed on the storage node contact plug adjacent to the bit line. Accordingly, a mask for forming the storage node contact and a mask for forming the bit line are respectively necessary, and the photoetching process must be carried out twice.

Moreover, as the integration degree of the cell is increased, a distance between the bit line and the storage node contact is decreased. Accordingly, in case the misalignment takes place during the process of forming the storage node contact hole 38 in order to form the storage node contact 40, the side portions of the bit line are exposed. In this case, the storage node contact formed in the storage node contact hole and the bit line are electrically short. In order to overcome the above-described disadvantage, there is further included the process of decreasing the diameter of the storage node contact hole by forming the hard mask. However, the whole process becomes more complicated.

SUMMARY OF THE INVENTION

Accordingly, it is an object of the present invention to provide a method for fabricating a dynamic random access memory DRAM cell which can simplify a fabrication process, and which can improve a step coverage of a contact by reducing an aspect ratio of contact holes by decreasing a height of the DRAM cell.

In order to achieve the above-described object of the present invention, there is provided a method for fabricating a dynamic random access memory DRAM cell including: a step of dividing a semiconductor substrate into an active region and an isolation region; a step of forming gates consisting of gate insulation films and gate electrodes on the semiconductor substrate; a step of forming first sidewall spacers at the side portions of the gates; a step of forming at the active region a first doped region and a second doped region operated as a source and a drain; a step of forming a first insulation film over the semiconductor substrate including the gates; a step of patterning the first insulation film, and of forming first contact holes and a second contact hole, respectively so that the upper surfaces of the first and second doped regions can be exposed; a step of forming storage node contact plugs and a bit line plug in the first and second contact holes, respectively; a step of forming a second insulation film over the semiconductor substrate including the storage node contact plugs and the bit line plug; a step of patterning the second insulation film, and of forming storage node contact holes and a bit line contact hole, respectively so that the upper surfaces of the node contact plugs and the bit line plug can be exposed; a step of forming on the second insulation film a bit line connected to the bit line plug through the bit line contact hole; a step of forming a third insulation film pattern on the bit line; a step of forming second sidewall spacers at the side portions of the bit line and the third insulation film pattern; a step of forming third sidewall spacers at the side portions of the storage node contact hole; a step of forming a fourth insulation film consisting of an oxide over the semiconductor substrate; a step of patterning the fourth insulation film, and of forming a fourth insulation film pattern; a step of forming a third conductive film over the semiconductor substrate including the fourth insulation film pattern; a step of forming a fifth insulation film consisting of an oxide on the third conductive film; a step of removing the third conductive film and the fifth insulation film so that the upper surface of the fourth insulation film pattern can be exposed; a step of removing the fourth insulation film pattern and the fifth insulation film; a step of forming a sixth insulation film consisting of an oxide or nitride on the third conductive film and the second insulation film pattern; and a step of forming a fourth conductive film on the sixth insulation film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a bit line and a capacitor of a dynamic random access memory DRAM cell in accordance with a preferred embodiment of the present invention will now be explained with reference to FIGS. 2a to 2i.

Figure 1A:
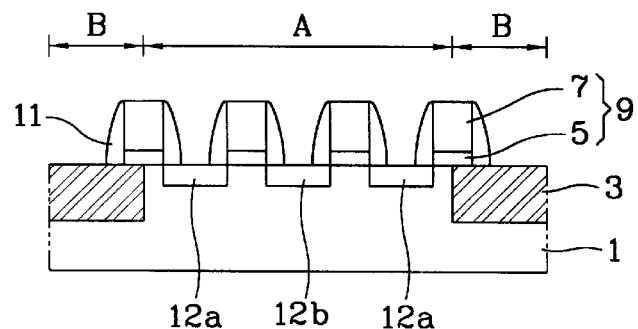
FIGS. 1a to 1k are vertical-sectional views illustrating sequential steps of a conventional method for fabricating a dynamic random access memory cell.
Figure 1B:
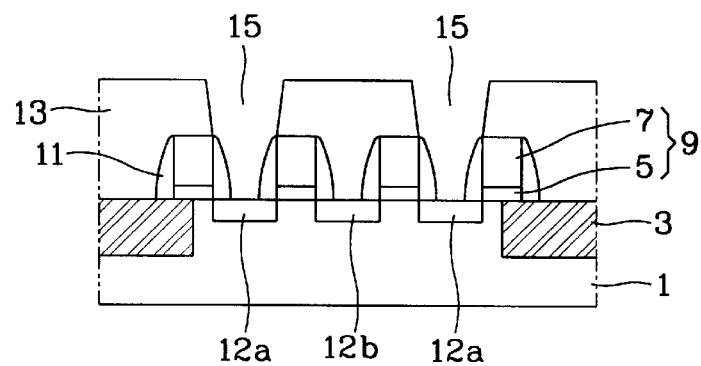
Figure 1C:
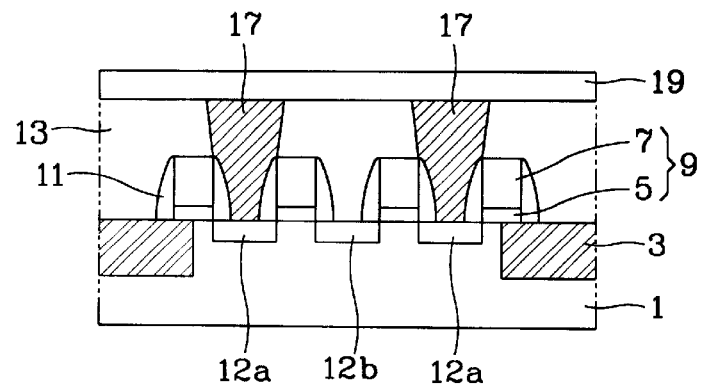
Figure 1D:
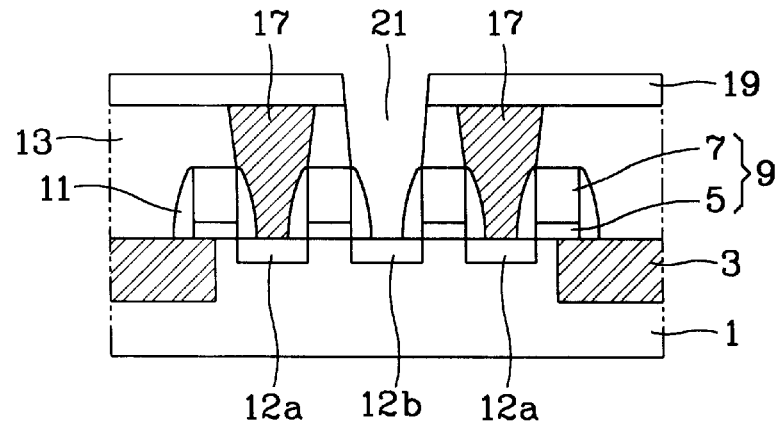
Figure 1E:
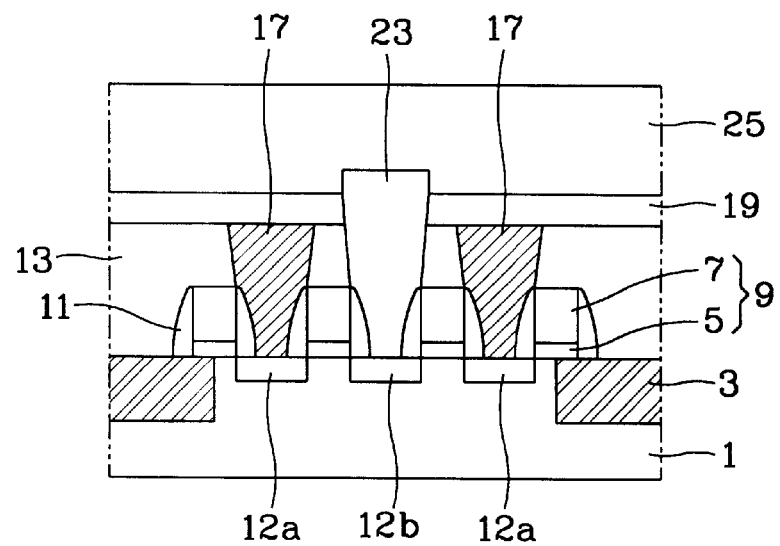
Figure 1F:
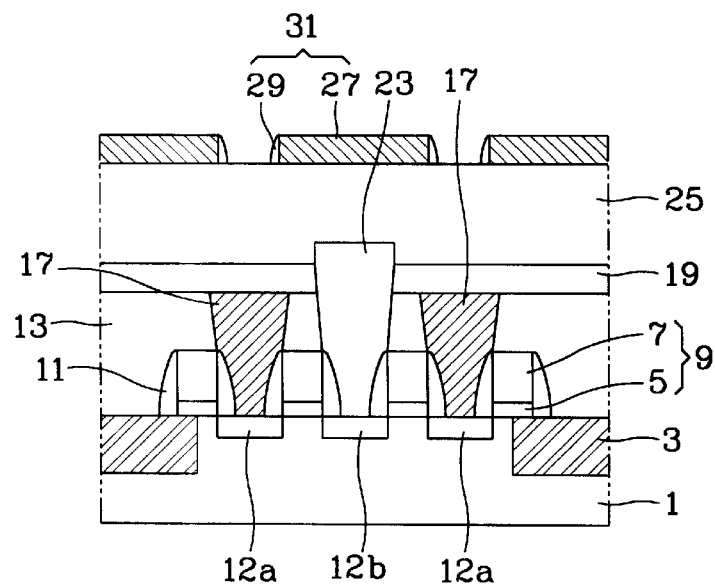
Figure 1G:
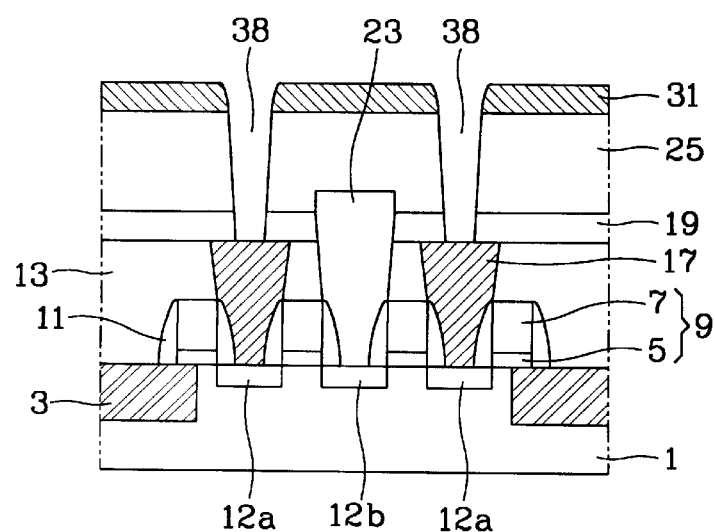
Figure 1H:
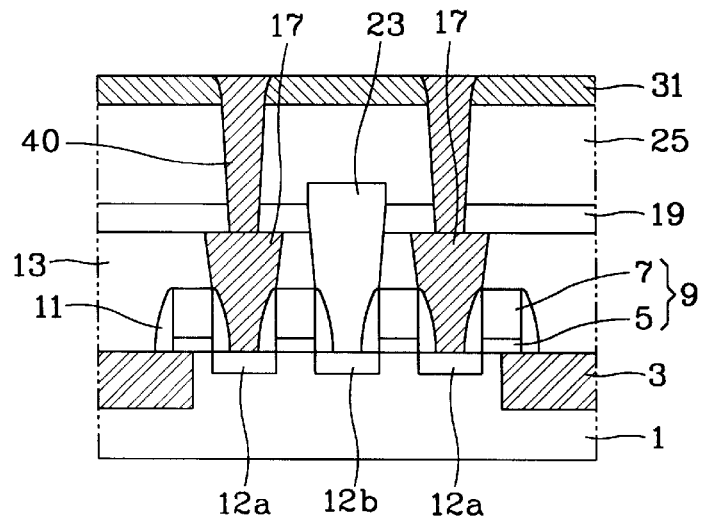
Figure 1I:
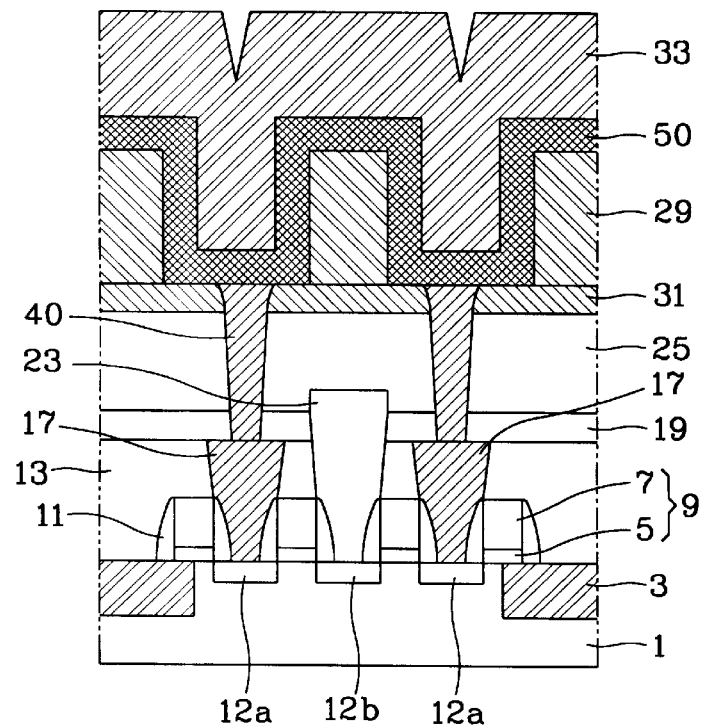
Figure 1J:
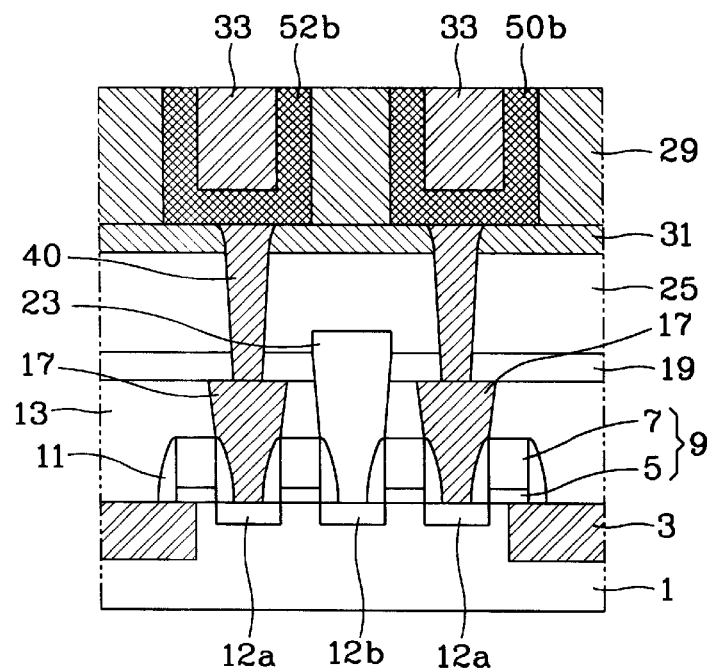
Figure 1K:
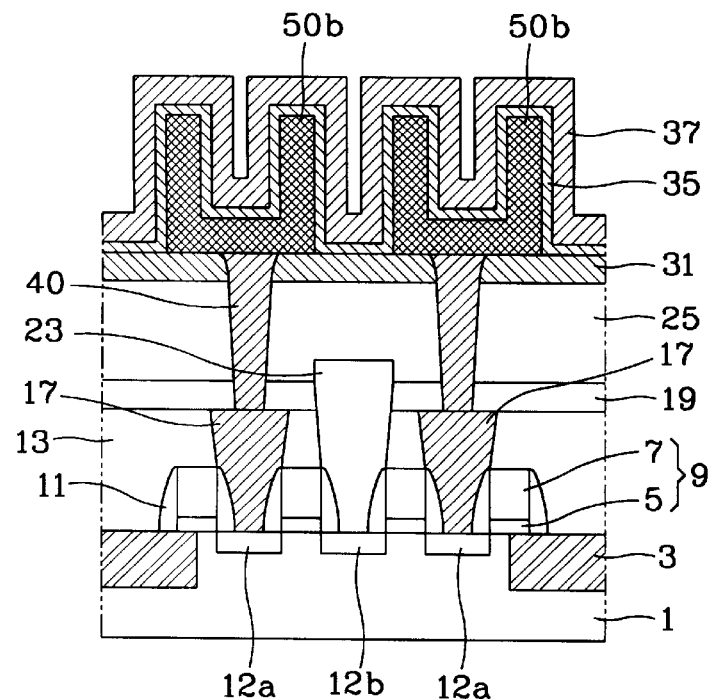
Figure 2A:
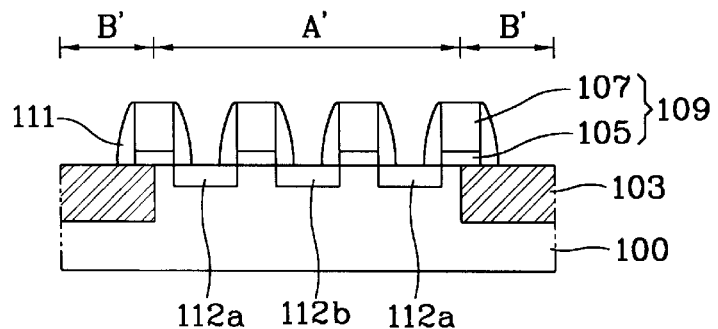
FIGS. 2a to 2i are vertical-sectional views illustrating sequential steps of a method for fabricating a dynamic random access memory cell in accordance with the present invention.

As illustrated in FIG. 2a, a trench is formed at an upper portion of the semiconductor substrate 100, and filled with an insulation material, thereby forming a field insulation film 103. A gate 109 consisting of a gate insulation film 105 and a gate electrode 107 is formed on the semiconductor substrate 100 divided into an active region A' and an isolation region B'. An insulation film is formed on the semiconductor substrate 100 including the gate 109, and an anisotropic etching process is carried out thereon without a mask, thereby forming first sidewall spacers 111 at the side portions of the gate 109. When a storage node contact plug 120a and a bit line plug 120b are formed in a succeeding process, the first sidewall spacers 111 serve to insulate the storage node contact plug 120a and the bit line plug 120b from the gate 109. A first doped region 112a and a second doped region 112b operated as a source and a drain are formed at the upper portion of the semiconductor substrate 100 between the gates 109 in accordance with an ion implantation process using the gate 109 and the first sidewall spacers 111 as masks.

Figure 2B:
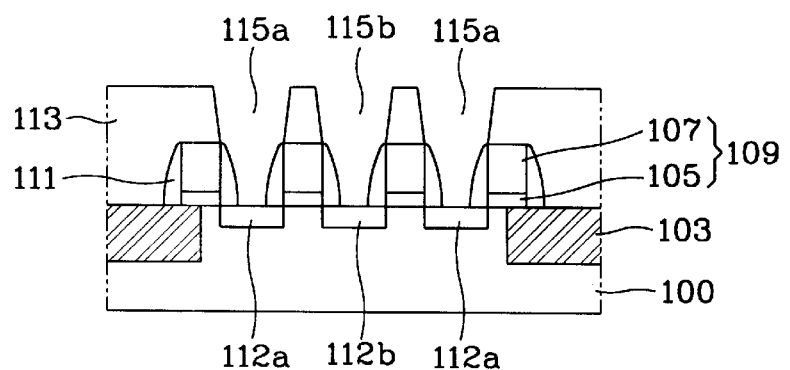

Referring to FIG. 2b, a first insulation film is formed over the semiconductor substrate 100. The first insulation film is patterned by using a photoresist film (not shown), and thus a first insulation film pattern 113 is formed in order to expose the upper surfaces of the first doped region 112a and the second doped region 112b between the gates 109. As a result, first contact holes 115a and a second contact hole 115b are formed at the same time.

Figure 2C:
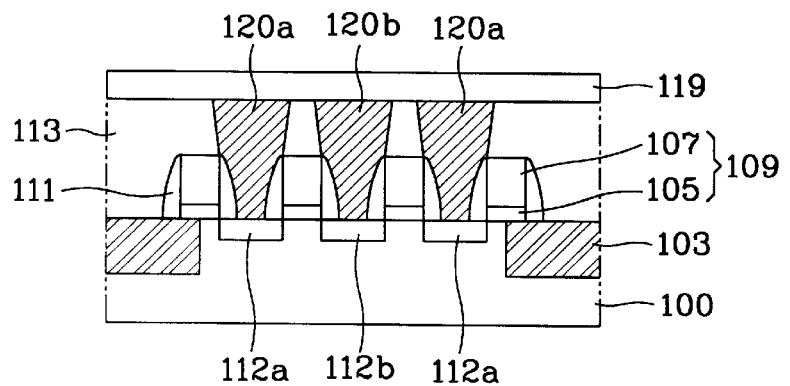

As shown in FIG. 2c, a first conductive film consisting of a polycrystalline silicon is formed in the first contact holes 115a and the second contact hole 115b, and on the first insulation film pattern 113. Thereafter, an etching or chemical mechanical polishing CMP process is performed until the upper surface of the first insulation film pattern 113 is exposed, and thus the storage node contact plug 120a and the bit line plug 120b which consist of the first conductive film are formed at the same time. The storage node contact plugs 120a are electrically connected to the first doped region 112a, and the bit line plug 120b serves to electrically connect the second doped region 112b to a bit line 130b to be discussed later.

The storage node contact plugs 120a and the bit line plug 120b are simultaneously formed by employing one mask, thereby simplifying the process.

Then, a second insulation film 119 operated as an interlayer insulation film is formed over the semiconductor substrate 100. The second insulation film 119 consists of an oxide, a nitride or a combination thereof, and its uppermost layer consists of a material which is not etched during an oxide film wet etching process, especially of a nitride.

Figure 2D:
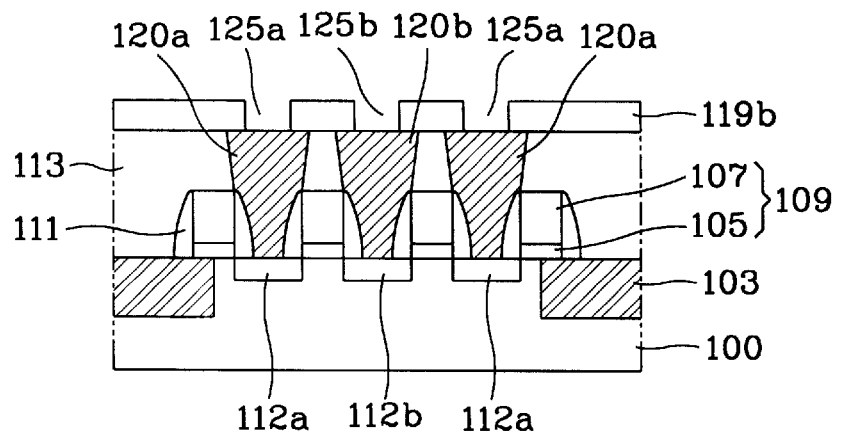

As depicted in FIG. 2d, the second insulation film 119 is photoetched in accordance with a photoetching process using a photoresist film (not shown), thereby forming a second insulation film pattern 119b, a storage node contact hole 125a and a bit line contact hole 125b at the same time. As the storage node contact hole 125a and the bit line contact hole 125b are simultaneously formed, a misalignment does not take place.

Figure 2E:
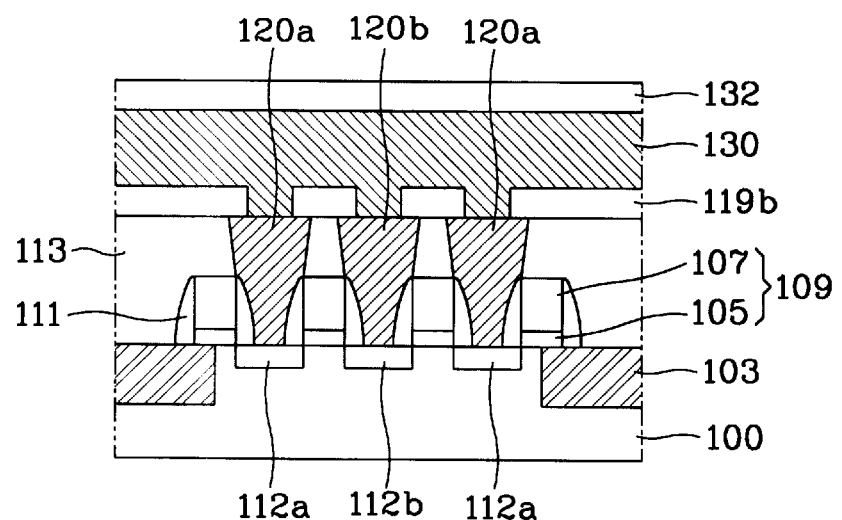

As shown in FIG. 2e, a second conductive film 130 is formed over the semiconductor substrate 100 including the storage node contact holes 125a and the bit line contact hole 125b. The second conductive film 130 consists of a material having a low resistance, especially a monolayer or multilayer consisting of a silicon Si, a tungsten W, a titanium Ti or a mixture thereof. Thereafter, a third insulation film 132 operated as an interlayer insulation film is formed on the second conductive film 130. The third insulation film 132 consists of an oxide, a nitride or a combination thereof, and its uppermost layer consists of a material which is not etched in the oxide film wet etching process, especially of a nitride.

Figure 2F:
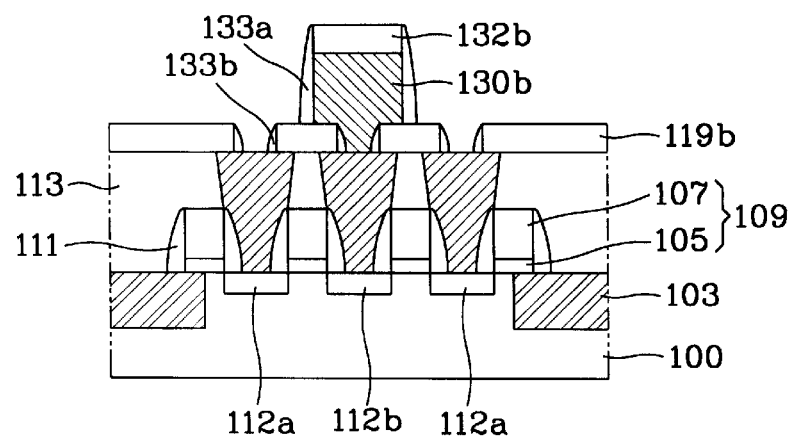

Referring to FIG. 2f, the bit line 130b is formed on the bit line plug 120b by patterning the third insulation film 132 and the second conductive film 130 in accordance with a photoetching process using a photoresist film (not shown) as a mask. A third insulation film pattern 132b is formed on the bit line 130b at the same time. Thereafter, an insulation film consisting of a nitride is formed over the semiconductor substrate 100, and an anisotropic etching process is performed thereon without a mask, thereby forming second sidewall spacers 133a at the side portions of the bit line 130b. Here, third sidewall spacers 133b consisting of a nitride are formed at the side portions of the storage node contact hole 125a at the same time. The second sidewall spacers 133a serve to insulate a lower electrode 139b of the capacitor to be formed in a succeeding process from the bit line 130b, and to prevent the third insulation film pattern 132b from being etched during a succeeding process of etching the oxide film. The third sidewall spacers 133b serve to prevent the second insulation film pattern 119b from being etched during the process of etching the oxide film. Since the bit line 130b can employs the second conductive film 130 having a low resistance, such as a tungsten W, a titanium Ti and the like, a resistance of the bit line 130b may be lower than that of a bit line consisting of a polycrystalline silicon.

Figure 2G:
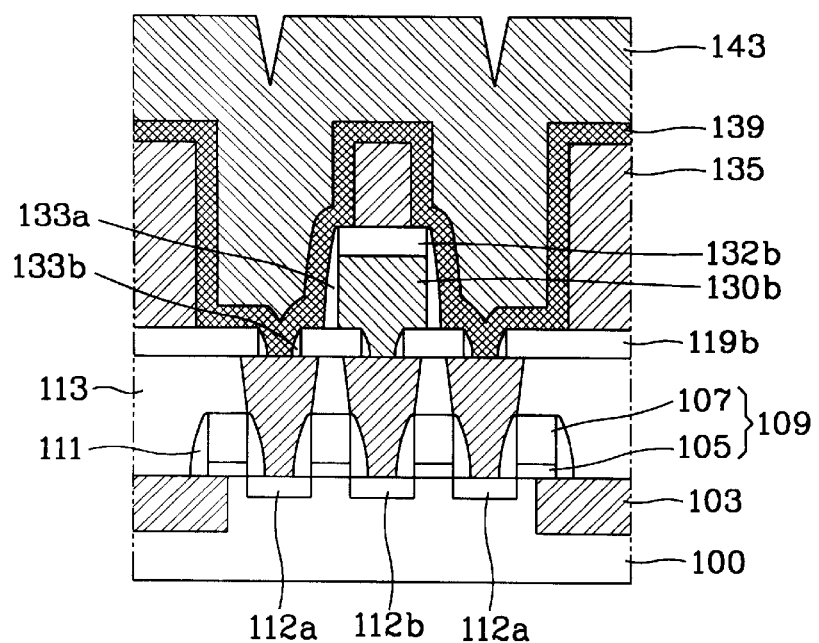

As illustrated in FIG. 2g, a fourth insulation film consisting of an oxide is formed over the semiconductor substrate 100 in FIG. 2f. The fourth insulation film is photoetched by using a photoresist film (not shown), thereby forming a fourth insulation film pattern 135. Thereafter, a third conductive film 139 forming the lower electrode of a capacitor is formed over the semiconductor substrate 100 including the fourth insulation film pattern 135. The third conductive film 139 consists of a polycrystalline silicon. A fifth insulation film 143 consisting of an oxide is formed on the third conductive film 139.

In accordance with the preferred embodiment of the present invention, when the fourth insulation film consisting of an oxide is photoetched in order to form the fourth insulation film pattern 135, the third sidewall spacers 133b formed at the side portions of the storage node contact holes 125a and consisting of a nitride and the like prevent the second insulation film pattern 119b from being etched. Accordingly, it is not necessary to form the storage node contacts in the storage node contact holes 125a, differently from the conventional art. As a result, the third conductive film 139 forming the lower electrode of the capacitor is directly connected to the storage node contact plug 120a through the storage node contact hole 125a.

Figure 2H:
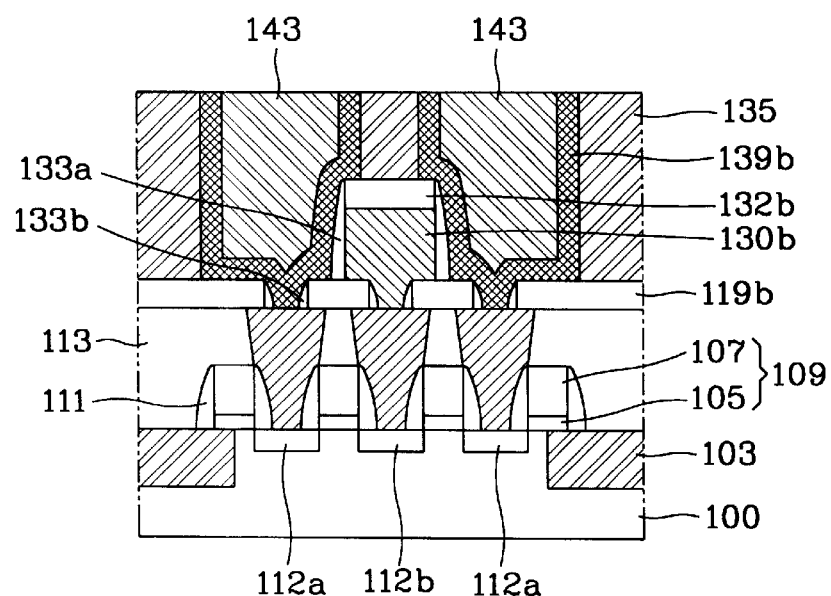

As depicted in FIG. 2h, an etching or CMP process is carried out until the upper surface of the fourth insulation film pattern 135 is exposed, and thus the lower electrode 139b is divided into storage cell units.

Figure 2I:
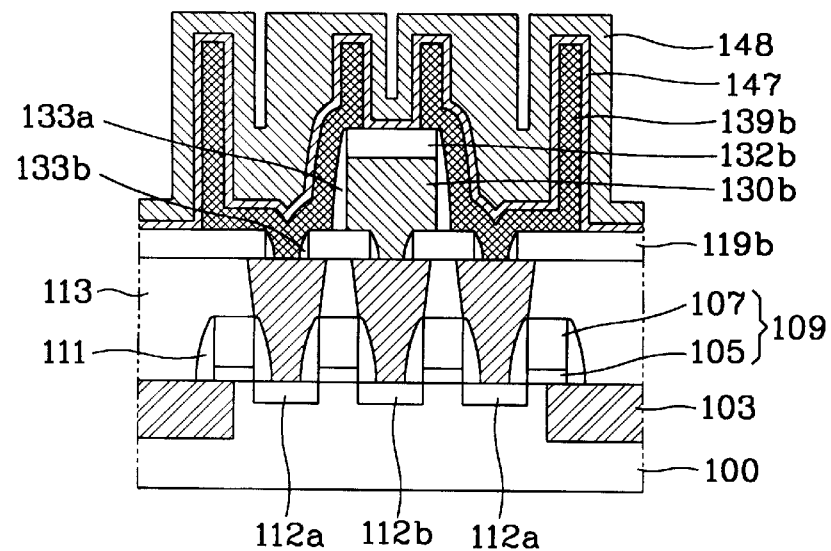

As shown in FIG. 2i, the fourth insulation film pattern 135 and the fifth insulation film 143 which consist of an oxide are removed according to a wet etching process. Here, the upper portions of the second insulation film pattern 119b and the third insulation film pattern 132b which consist of a nitride serve to prevent the second insulation film pattern 119b and the third insulation film pattern 132b from being etched. Thereafter, a sixth insulation film 141 operated as a capacitor dielectric film is formed on the entire surface of the semiconductor substrate 100. The sixth insulation film 147 consists of an oxide or nitride. Thereafter, a fourth conductive film 148 forming an upper electrode of the capacitor and consisting of a polycrystalline silicon is deposited on the sixth insulation film 147, and thus the fabrication of the DRAM cell in accordance with the present invention is finished.

According to the method for fabricating the DRAM cell of the present invention, the storage node contact 120a and the bit line contact 120b are formed at the same time by employing one mask, thereby reducing one step of photoetching process.

In addition, in accordance with the present invention, since the storage node contact holes and the bit line contact hole are simultaneously formed, the misalignment does not take place. Accordingly, the hard mask is not necessary as in the conventional art, thereby simplifying the process.

Moreover, in accordance with the present invention, the second sidewall spacers 133a insulate the bit line 130b from the lower electrode 139b of the capacitor. Therefore, the interlayer insulation film 25 insulating the bit line 23 from the capacitor lower electrode 50b in the conventional art is no more necessary, and the planarization process performed after forming the interlayer insulation film 25 is not necessary, either. As a result, the process is simplified, and productivity and reliability are increased.

In accordance with the present invention, the third sidewall spacers 133b prevent the second insulation film pattern 119b from being etched during the process of forming the fourth insulation film pattern 135. Accordingly, the storage node contacts are unnecessary, thereby simplifying the process.

In addition, in accordance with the present invention, the interlayer insulation film 25 is not required, and thus the height of the cell is reduced. As the cell height is decreased, the aspect ratio of the contact hole is decreased. Thus, when the contacts are formed at the cell region and the periphery region of the DRAM, the step coverage is improved, which results in improved stability and reliability of the device.

Furthermore, in accordance with the present invention, as the cell height is decreased, an area of the capacitor insulation film of the cell having an identical height to the conventional one can be increased. As the quantity of charge which the capacitor can accumulate is in direct proportion to the area of the capacitor insulation film, it can be increased.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a dynamic random access memory cell, comprising:
    a step for forming at least one gate on the semiconductor substrate;
    a step for forming first sidewall spacers at the side portions of the gate;
    a step for forming at least one source/drain region;
    a step for forming a first insulation film over the semiconductor substrate including the gate;
    a step for patterning the first insulation film, and for forming at least one first contact hole and at least one second contact hole, respectively so that the upper surface of the source/drain can be exposed;
    a step for forming at least one storage node contact plug and at least one bit line plug in the first and second contact hole, respectively;
    a step for forming a second insulation film over the semiconductor substrate including the storage node contact plug and the bit line plug;
    a step for patterning the second insulation film, and for forming at least one storage node contact hole and at least one bit line contact hole, respectively so that the upper surface of the node contact plug and the bit line plug can be exposed;
    a step for forming on the second insulation film at least one bit line connected to the bit line plug through the bit line contact hole;
    a step for forming a third insulation film pattern on the bit line;
    a step for forming second sidewall spacers at the side portions of the bit line and the third insulation film pattern;
    a step for forming third sidewall spacers at the side portions of the storage node contact hole;
    a step for forming a fourth insulation film over the semiconductor substrate;
    a step for patterning the fourth insulation film, and for forming a fourth insulation film pattern;
    a step for forming a third conductive film over the semiconductor substrate including the fourth insulation film pattern;
    a step for forming a fifth insulation film on the third conductive film;
    a step for removing the third conductive film and the fifth insulation film so that the upper surface of the fourth insulation film pattern can be exposed;
    a step for removing the fourth insulation film pattern and the fifth insulation film;
    a step for forming a sixth insulation film on the third conductive film and the second insulation film pattern; and
    a step for forming a fourth conductive film on the sixth insulation film.

2. The method according to claim 1, wherein the first contact hole and the second contact hole are formed by spreading a photoresist film on the first insulation film, and by performing a photoetching process thereon.

3. The method according to claim 1, wherein the storage node contact plug and the bit line plug are formed by forming a first conductive film in the first contact hole and the second contact hole, and on the first insulation film, and by removing the first conductive film until the first insulation film is exposed.

4. The method according to claim 3, wherein the first conductive film consists of a polycrystalline silicon.

5. The method according to claim 3, wherein the first conductive film is removed in accordance with an etching or a chemical mechanical polishing process.

6. The method according to claim 1, wherein the second insulation film consists of at least one of an oxide, a nitride and a combination thereof, and its uppermost layer consists of a material which is not etched when the oxide film is etched.

7. The method according to claim 1, wherein the bit line and the third insulation film pattern are formed by forming a second conductive film in the storage node contact hole and the bit line contact hole, and on the second insulation film pattern, by forming a third insulation film on the second conductive film, and by patterning the third insulation film and the second conductive film.

8. The method according to claim 7, wherein the third insulation film and the second conductive film are patterned by spreading a photoresist film on the third insulation film, and by performing a photoetching process thereon.

9. The method according to claim 7, wherein the second conductive film consists of at least one of a silicon, a tungsten, a titanium and a mixture thereof.

10. The method according to claim 1, wherein the second sidewall spacers and the third sidewall spacers are formed by forming an insulation film at the upper and side portions of the third insulation film pattern and the bit line, at the upper portion of the second insulation film pattern, and in the storage node contact hole, and by carrying out an anisotropic etching process thereon without a mask.

11. The method according to claim 1, wherein the second sidewall spacers and the third sidewall spacers consist of a material which is not etched when the oxide film is etched.

12. The method according to claim 1, wherein the third insulation film consists of at least one of an oxide, a nitride and a combination thereof, and its uppermost layer consists of a material which is not etched when the oxide film is etched.

13. The method according to claim 1, wherein the fourth insulation film and the fifth insulation film consist of an oxide.

14. The method according to claim 1, wherein the third conductive film and the fourth conductive film consist of a polycrystalline silicon.

15. The method according to claim 1, wherein the step of removing the third conductive film and the fifth insulation film so that the upper surface of the fourth insulation film pattern can be exposed is performed in accordance with an etching or a chemical mechanical polishing process.

16. The method according to claim 1, wherein the step for removing the fourth insulation film pattern and the fifth insulation film is carried out in accordance with an wet etching process.

17. The method according to claim 1, wherein the sixth insulation film consists of an oxide or a nitride.

* * * * *